(12) United States Patent
Chang et al.

(10) Patent No.: US 8,198,112 B2
(45) Date of Patent: Jun. 12, 2012

(54) LASER DIODES COMPRISING QWI OUTPUT WINDOW AND WAVEGUIDE AREAS AND METHODS OF MANUFACTURE

(75) Inventors: Chwan-Yang Chang, Hsinchu (TW); Chien-Chih Chen, Ciaotou Township, Kaohsiung County (TW); Martin Hai Hu, Painted Post, NY (US); Hong Ky Nguyen, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 122 days.

(21) Appl. No.: 12/760,092

(22) Filed: Apr. 14, 2010

(65) Prior Publication Data

US 2011/0255567 A1 Oct. 20, 2011

(51) Int. Cl.
*H01L 21/00* (2006.01)
*H01L 31/0256* (2006.01)
(52) U.S. Cl. ............................................. 438/35; 257/76
(58) Field of Classification Search .................. 257/186, 257/461, 76, 89; 438/28, 35
See application file for complete search history.

(56) References Cited

U.S. PATENT DOCUMENTS

| | | | |
|---|---|---|---|
| 4,523,316 A | 6/1985 | Botez | 372/45 |
| 4,845,725 A | 7/1989 | Welch et al. | 372/46 |
| 4,856,017 A | 8/1989 | Ungar | 372/96 |
| 5,144,634 A | 9/1992 | Gasser et al. | 372/49 |
| 5,171,717 A | 12/1992 | Broom et al. | 437/226 |
| 6,677,618 B1 | 1/2004 | Horie et al. | 257/94 |
| 7,274,081 B2 * | 9/2007 | Iguchi | 257/446 |
| 7,567,603 B2 | 7/2009 | Peters et al. | 372/45.01 |
| 2007/0246701 A1 * | 10/2007 | Yanson et al. | 257/15 |

* cited by examiner

*Primary Examiner* — Calvin Lee
(74) *Attorney, Agent, or Firm* — Svetlana Z. Short

(57) ABSTRACT

In accordance with one embodiment of the present disclosure, a process of manufacturing a semiconductor laser diode comprising a gain section, a QWI output window, and QWI waveguide areas is provided. The QWI waveguide areas are fabricated using quantum well intermixing and define a QWI waveguide portion in the QWI output window of the laser diode. The QWI output window is transparent to the lasing wavelength $\lambda_L$. The QWI waveguide portion in the QWI output window is characterized by an energy bandgap that is larger than an energy bandgap of the gain section such that the band gap wavelength $\lambda_{QWI}$ in the QWI waveguide portion and the QWI output window is shorter than the lasing wavelength $\lambda_L$. The QWI output window is characterized by a photoluminescent wavelength $\lambda_{PL}$. The manufacturing process comprises a $\lambda_{PL}$ screening protocol that determines laser diode reliability based on a comparison of the lasing wavelength $\lambda_L$ and the photoluminescent wavelength $\lambda_{PL}$ of the QWI output window. Additional embodiments are disclosed and claimed.

15 Claims, 1 Drawing Sheet

LASER DIODES COMPRISING QWI OUTPUT WINDOW AND WAVEGUIDE AREAS AND METHODS OF MANUFACTURE

BACKGROUND OF THE INVENTION

1. Field of the Invention

The present disclosure relates to semiconductor lasers including transparent output windows and, more particularly, to methods for fabrication of such lasers and to the reliability of such lasers.

2. Technical Background

The present inventors have recognized that the lifetime of edge-emitting semiconductor lasers is often shortened by failures caused by catastrophic optical mirror damage (COMD) at and near the output facets. The mechanism of COMD involves a few related physical processes, occurring at and near a laser output facet, including absorption of light, oxidation of semiconductor material, electrical current on the facet surface and non-radiation recombination of free carriers at defect centers. Theoretically, these physical processes can interact with one another and cause rapid temperature rise, which in turn accelerates the above-noted physical processes, increasing the likelihood of laser facet melting, defect growth, and laser failure.

Facet passivation is often employed to reduce the aforementioned COMD failure rate. However, some passivation techniques can be relatively low throughput processes and often require sophisticated equipment, and are often not suitable for mass production. An example is the E-2 passivation process, where laser bars are cleaved in ultra-high vacuum and are immediately treated with protective layers to prevent oxidation of semiconductor materials at the facets. Alternative passivation processes, such as processes where laser bars with transparent output windows are cleaved in air and there is no in-situ thin silicon coating on the cleaved facets, are more suitable for mass production but have not been recognized to be as effective as more cumbersome passivation processes, such as the E-2 process.

BRIEF SUMMARY

Although the methodology of the present disclosure has applicability to a variety of semiconductor laser configurations, the present inventors have recognized that the need for effective transparent output windows is particularly acute in the context of synthetic 530-nm green lasers, where the output of a native IR laser source (e.g., a 1060-nm distributed-Bragg-reflector (DBR) laser) is frequency-doubled by a suitable wavelength conversion device because the native laser diode needs to meet very stringent requirements on lifetime and reliability. The present inventors have further recognized that the majority of failure locations in DBR and other types of laser diodes are at and near the output facets, in the category of COMD.

Quantum well intermixing (QWI) is a post-growth method of bandgap engineering known to be useful in modifying the properties of a semiconductor quantum well structure and is commonly utilized to form various portions of a semiconductor laser such as, for example, waveguide portions, output windows, etc. A variety of QWI techniques have been introduced including, but not limited to, rapid thermal annealing, ion-implantation disordering, impurity free vacancy induced intermixing, photo-absorption induced intermixing, impurity-induced layer intermixing, etc. In the context of QWI output windows, through examination of the windows of reliable and unreliable laser diodes, the present inventors have found that it is possible to use relatively simple, low-cost facet forming process and still be able to achieve good reliability by referring to the minimum bandgap wavelength shift of the transparent QWI output window of the laser and using this information to arrive at a method of quantifying the reliability of the laser.

In accordance with one embodiment of the present disclosure, a process of manufacturing a semiconductor laser diode comprising a gain section, a QWI output window, and QWI waveguide areas is provided. The QWI waveguide areas are fabricated using quantum well intermixing and define a QWI waveguide portion in the QWI output window of the laser diode. The QWI output window is transparent to the lasing wavelength $\lambda_L$. The QWI waveguide portion in the QWI output window is characterized by an energy bandgap that is larger than an energy bandgap of the gain section such that the band gap wavelength $\lambda_{QWI}$ in the QWI waveguide portion and the QWI output window is shorter than the lasing wavelength $\lambda_L$. The QWI output window is characterized by a photoluminescent wavelength $\lambda_{PL}$. The manufacturing process comprises a $\lambda_{PL}$ screening protocol that determines laser diode reliability based on a comparison of the lasing wavelength $\lambda_L$ and the photoluminescent wavelength $\lambda_{PL}$ of the QWI output window.

In accordance with another embodiment of the present disclosure, the semiconductor laser diode is characterized by a critical absorption wavelength $\lambda_C$ and the manufacturing process comprises a $\lambda_{PL}$ screening protocol that determines laser diode reliability by determining whether the photoluminescent wavelength $\lambda_{PL}$ of the QWI output window is low enough to ensure that the corresponding temperature at which $\lambda_C=\lambda_L$ falls outside of the operating temperature range of the laser.

In accordance with yet another embodiment of the present disclosure, a semiconductor laser diode is provided comprising a gain section, a QWI output window, and QWI waveguide areas. The QWI waveguide areas are fabricated using quantum well intermixing and define a QWI waveguide portion in the QWI output window of the laser diode. The QWI output window is transparent to the lasing wavelength $\lambda_L$. The QWI waveguide portion in the QWI output window is characterized by an energy bandgap that is larger than an energy bandgap of the gain section such that the band gap wavelength $\lambda_{QWI}$ in the QWI waveguide portion and the QWI output window is shorter than the lasing wavelength $\lambda_L$. The lasing wavelength $\lambda_L$ is approximately 1060 nm and the photoluminescent wavelength $\lambda_{PL}$ of the QWI output window is less than approximately 993 nm. In another embodiment, the energy band gap of the QWI output window is at least 79 meV larger than that corresponding to the lasing wavelength $\lambda_L$.

BRIEF DESCRIPTION OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
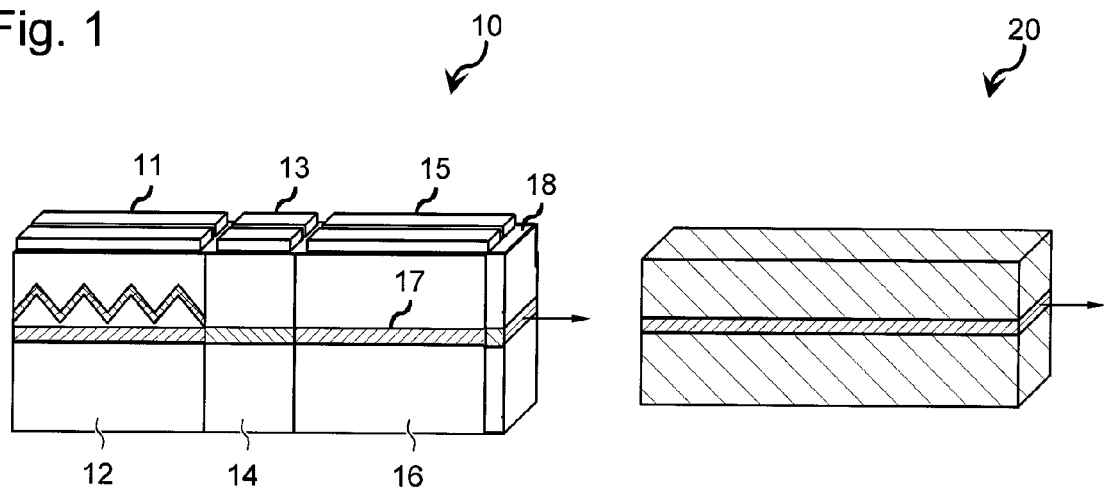
FIG. 1 is a schematic illustration of a frequency converted laser source including a DBR laser suitable for the methodology of the present disclosure.

FIG. 1 is a schematic illustration of a frequency converted laser source comprising a DBR laser 10 operating, for example, at 1060 nm, and a wavelength conversion device 20 configured for second harmonic generation (SHG) to double the frequency of the 1060 nm signal. The particular structure of the DBR laser 10 is beyond the scope of the present disclosure and can be taken from a variety of teachings on the subject. Generally, the DBR laser 10 comprises four sections: a wavelength-selective section 12, an optional phase section 14, a gain section 16, and a QWI output window 18. The wavelength selective section 12, which can also be referred to as the DBR section of the laser 10, typically comprises a first order or second order Bragg grating positioned outside the active region of the laser cavity. This section provides wavelength selection, as the grating acts as a mirror whose reflection coefficient depends on wavelength. The gain section 16 of the DBR laser 10 provides the optical gain of the laser and the phase section 14 can be provided for fine wavelength control.

The QWI output window 18 is generally provided to enhance durability and reliability and is not provided with control electrodes; however control electrodes 11, 13, 15 are illustrated schematically in the wavelength-selective, phase, and gain sections 12, 14, 16. Reflective coatings are typically applied at the QWI output window 18 and the opposite-end facet of the DBR laser 10. To reduce optical absorption in the laser 10, the wavelength-selective section 12, the phase section 14, and the QWI output window 18 comprise corresponding QWI waveguide areas where the band gaps of the respective sections are shifted to a shorter wavelength (or higher energy), relative to the lasing wavelength of the gain section 16, by a quantum well intermixing (QWI) process. Collectively these QWI waveguide areas are illustrated schematically as a quantum well intermixed (QWI) waveguide 17 extending along the longitudinal axis of the DBR laser 10 in the wavelength-selective section 12, the phase section 14 and the output window 18 of the DBR laser. Typically, there is no quantum well intermixing in the gain section 10.

The present inventors have recognized that low absorption in the QWI waveguide 17, which includes portions in the QWI output window 18, is closely related to the reliability of lasers with A0 facets, which commonly include air cleaved output windows without in situ passivation. Further, this low absorption in the QWI waveguide 17 is recognized herein as a strong indicator of whether the A0 facets of the lasers are reliable. According to the present disclosure, the absorption level in QWI areas of a laser diode can be evaluated by measuring i) the QWI waveguide photoluminescence (PL) wavelength after quantum-well intermixing of a wafer, and ii) the phase-section photo-current of completed individual laser. For example, as is explained in further detail below, in the case of 1060 nm DBR lasers with A0 facets, it is contemplated that a QWI waveguide PL wavelength shorter than 993 nm, i.e., a wavelength shortening of 67 nm (or a energy band-gap broadening of at least 79 meV) as compared to the lasing wavelength $\lambda_L$, can serve as a suitable reliability benchmark. It is also contemplated that this benchmark will be applicable to other types of semiconductor lasers emitting in other portions of the optical spectrum.

The methodology of the present disclosure can be utilized in manufacturing reliable semiconductor laser diodes 10 that comprise QWI waveguide portions in the passive sections 12, 14 of the laser diode 10 and in the QWI output window 18 of the laser diode 10. The methodology can also be used in screening unreliable semiconductor laser diodes 10. These QWI waveguide portions of the laser diode 10 are fabricated using quantum well intermixing and will be characterized by an energy bandgap that is larger than the energy bandgap of the gain section 16. As such, the band gap wavelength $\lambda_{QWI}$ in the QWI waveguide portions of the passive sections 12, 14 and the QWI output window 18 will be shorter than the lasing wavelength $\lambda_L$ of the laser diode 10. The present inventors have recognized that the band gap wavelength $\lambda_{QWI}$ of the QWI output window 18 is directly related to the photoluminescent wavelength $\lambda_{PL}$ of the QWI output window 18 and that a $\lambda_{PL}$ screening protocol can be used to determine laser diode reliability. According to the $\lambda_{PL}$ screening protocol, the intended lasing wavelength $\lambda_L$ is compared to the photoluminescent wavelength $\lambda_{PL}$ and the comparison is used to determine whether the laser diode 10, which may include a QWI output window 18 cleaved in air, can be manufactured successfully or will be suitable for various intended uses.

More specifically, it is contemplated that the photoluminescent wavelength $\lambda_{PL}$ of the QWI output window 18 can be determined by measuring the photoluminescent wavelength $\lambda_{PL}$ of the QWI areas on a wafer, perhaps most conveniently soon after quantum well intermixing. A variety of methods may be utilized to measure the photoluminescent wavelength $\lambda_{PL}$ of the QWI output window 18 including, for example, direct measurement of luminescence spectra. Alternatively, it is contemplated that the photoluminescent wavelength $\lambda_{PL}$ of the QWI output window 18 can be determined using an electrical signal from one or more of the passive sections 12, 14 of the laser 10 and referring to the resulting photo-current $I_{PHOTO}$ when the gain section 16 is electrically pumped to produce lasing light. This alternative method of determination works because the passive sections 12, 14 go through the same QWI process as the window 18 and, as such, are expected to have a similar photoluminescent wavelength and coefficient of optical absorption.

To further illustrate the above-noted alternative method of determining the photoluminescent wavelength $\lambda_{PL}$ of the QWI output window 18, it is noted that the photo-current $I_{PHOTO}$ can be determined according to the following relation:

$$I_{PHOTO} = I_{PHASE} - (V_{GAIN} - V_{PHASE})/R$$

where $I_{phase}$ is the total current at a passive section of the laser diode 10, $V_{GAIN}$ is the voltage drop on the gain section 16, $V_{PHASE}$ is the voltage drop on the passive section, and R represents an isolation resistance between the passive section and the gain section 16. As is noted above, the passive section can be the wavelength selective section 12 or a phase section 14 of a three section DBR laser 10. In many cases, the present inventors have noted that reliable laser diodes will be characterized by photo-currents $I_{PHOTO}$ less than 2 mA depending on the heat-sink temperature and the gain-section current.

Figure 2:
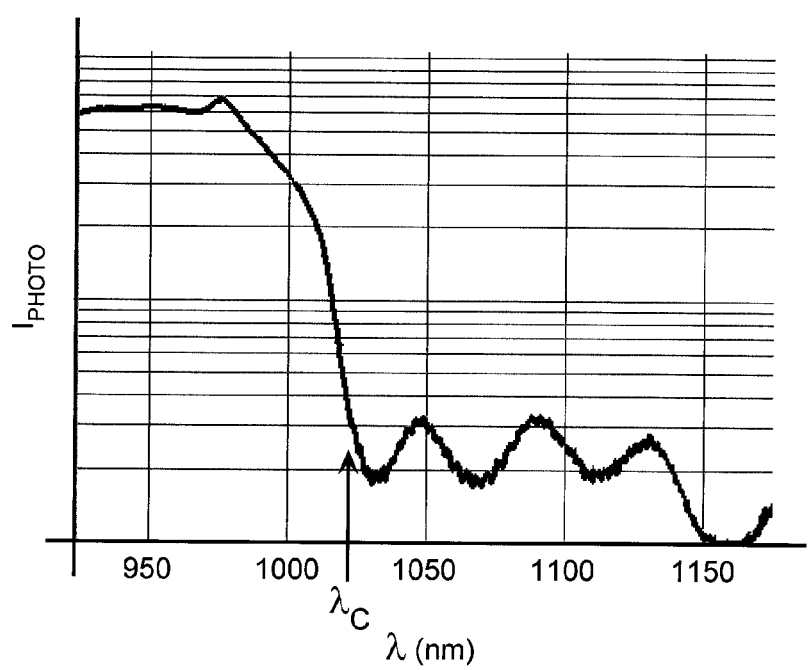
FIG. 2 is an illustration of laser diode critical absorption wavelength $\lambda_C$.

Referring to FIG. 2, the present inventors have recognized that semiconductor lasers can often be characterized by a critical absorption wavelength $\lambda_C$, where photo current begins to increase abruptly due to a change in the absorption mechanism within the laser diode. Photo current at wavelengths longer than critical absorption wavelength $\lambda_C$ are generally associated with deep-level absorption, while acceptor and quantum well absorption are primarily involved at wavelengths shorter than the critical absorption wavelength $\lambda_C$. Accordingly, it is contemplated that the $\lambda_{PL}$ screening protocol can be modified to determine laser diode reliability by determining whether the photoluminescent wavelength $\lambda_{PL}$ of the QWI output window is low enough to ensure that the corresponding temperature at which $\lambda_C = \lambda_L$ falls outside of the operating temperature range of the laser.

For example, in the case of a 1060 nm DBR laser, the absorption of the DBR laser emission increases rapidly with temperature. Even if the optical absorption is low at room temperature, the optical absorption increases rapidly as temperature increases because, for a DBR laser, the QWI photoluminescent wavelength $\lambda_{PL}$ increases more rapidly with temperature, as compared to the lasing wavelength $\lambda_L$. Optical absorption increases abruptly once the critical wavelength $\lambda_C$ becomes equal to the lasing wavelength $\lambda_L$. The heat sink temperature of a laser structure can be used as an indicator of the point at which the critical wavelength $\lambda_C$ becomes equal to the lasing wavelength $\lambda_L$. For example, the heat-sink temperature at which $\lambda_C$ is equal to $\lambda_L$ has been estimated to be 146° C. for lasers that have $\lambda_L=1060$ nm and a QWI photoluminescent wavelength $\lambda_{PL}$ of 979 nm at 25° C. However, the heat-sink temperature at which $\lambda_C$ is equal to $\lambda_L$ has been estimated to be 85° C. for lasers that have a QWI photoluminescent wavelength $\lambda_{PL}$ of 993 nm. In other words, if the QWI photoluminescent wavelength $\lambda_{PL}$ is 993 nm at room temperature the maximum heat sink temperature for a DBR laser to reliably operate is 85° C. Conversely, if the QWI photoluminescent wavelength $\lambda_{PL}$ is 979 nm at room temperature the maximum heat sink temperature for a DBR laser to reliably operate is 146° C. Usually the maximum operating temperature is set by the application in which a DBR laser is used. Typically, the QWI photoluminescent wavelength $\lambda_{PL}$ should be sufficiently short at room temperature to ensure that the lasing wavelength $\lambda_L$ is always longer than the critical wavelength $\lambda_C$ over the desired temperature range. Reliable DBR lasers will have a QWI photoluminescent wavelength $\lambda_{PL}$ shorter than 993 nm to avoid strong absorption of the DBR laser emission in the transparent window of the laser at operating temperature as high as 85° C.

As is noted above, a QWI waveguide PL wavelength shorter than 993 nm can be associated with an energy bandgap E that is at least 79 meV larger than that corresponding to the lasing wavelength $\lambda_L$. To further explain this relationship, it is noted that the bandgap energy, in eV, can be related to wavelength $\lambda$ in nm, by the following formula:

$$E = 1240/\lambda$$

The difference of band gap energies between the lasing light of the laser 10 and the QWI output window 18 can be calculated as follows:

$$\Delta E = E_{WINDOW} - E_{GAIN}$$

where the lasing wavelength $\lambda_L$ is determined by the grating that is fabricated on the DBR section of the laser. So, the following relation needs to be satisfied to maintain the output window energy bandgap for a 1060 nm laser at least 79 meV larger than that corresponding to the lasing wavelength at room temperature:

$$E_{WINDOW} - E_{GAIN} \geq 79 \text{ meV}$$

Noting that $$E_{GAIN} = 1240/1060 \text{ nm and } E_{WINDOW} = 1240/\lambda PL$$

we have $$(1240/\lambda_{PL}) - (1240/1060) \geq 0.079$$

and can see that $$\lambda_{PL} \leq 993 \text{ nm.}$$

This constraint on the photoluminescent wavelength of the QWI output window is valid at room temperature and effectively reduces optical absorption at the transparent window and blocks current leakage from the gain section to the transparent window. As temperature increases, the value of $\Delta E$ decreases. For example, when temperature increases from 25° C. to 85° C., $\Delta E$ is reduced from 79 meV to 61 meV. However, at 85° C., $\Delta E=61$ meV is still sufficient to reduce optical absorption at the transparent window and block current leakage from the gain section to transparent window.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A process of manufacturing a semiconductor laser diode comprising a gain section, a QWI output window, and QWI waveguide areas, wherein:
   the semiconductor laser diode is characterized by a lasing wavelength $\lambda_L$;
   the QWI waveguide areas are fabricated using quantum well intermixing and define a QWI waveguide portion in the QWI output window of the laser diode;
   the QWI output window is transparent to the lasing wavelength $\lambda_L$;
   the QWI waveguide portion in the QWI output window is characterized by an energy bandgap that is larger than an energy bandgap of the gain section such that the band gap wavelength $\lambda_{QWI}$ in the QWI waveguide portion and the QWI output window is shorter than the lasing wavelength $\lambda_L$;
   the QWI output window is characterized by a photoluminescent wavelength $\lambda_{PL}$; and
   the manufacturing process comprises a $\lambda_{PL}$ screening protocol that determines laser diode reliability based on a comparison of the lasing wavelength $\lambda_L$ and the photoluminescent wavelength $\lambda_{PL}$ of the QWI output window.

2. A process as claimed in claim 1 wherein the energy bandgap of the QWI output window is determined by measuring the photoluminescent wavelength $\lambda_{PL}$ of the QWI areas including the QWI output window.

3. A process as claimed in claim 2 wherein the photoluminescent wavelength $\lambda_{PL}$ of the QWI output window is determined after the QWI waveguide areas are fabricated using quantum well intermixing.

4. A process as claimed in claim 2 wherein the photoluminescent wavelength $\lambda_{PL}$ of the QWI output window is determined by measuring luminescence spectra.

5. A process as claimed in claim 1 wherein:
the semiconductor laser diode further comprises one or more passive sections;
the QWI waveguide areas further define a QWI waveguide portion in the passive sections of the laser diode;
the QWI waveguide portion in the passive sections of the laser diode is characterized by an energy bandgap that is larger than an energy bandgap of the gain section;
the photoluminescent wavelength $\lambda_{PL}$ of the QWI output window is determined by referring to a determination of photo-current $I_{PHOTO}$ resulting from optical absorption at one or more of the passive sections of the laser when the gain section is electrically pumped to produce lasing light.

6. A process as claimed in claim 5 wherein the photo-current $I_{PHOTO}$ resulting from optical absorption at one or more of the passive sections of the laser is determined according to the following relation:

$$I_{PHOTO}=I_{PHASE}-(V_{GAIN}-V_{PHASE})/R$$

where $I_{phase}$ is the total current at the passive section, $V_{GAIN}$ is the voltage drop on the gain section, $V_{PHASE}$ is the voltage drop on the passive section, and R represents an isolation resistance between the passive section and the gain section.

7. A process as claimed in claim 6 wherein the passive section comprises a phase section of a three section DBR laser.

8. A process as claimed in claim 6 wherein the $\lambda_{PL}$ screening protocol determines that the laser diode is reliable when the photo-current $I_{PHOTO}$ is less than 2 mA depending on the heat-sink temperature and the gain-section current.

9. A process as claimed in claim 1 wherein:
the semiconductor laser comprises a three section DBR laser comprising one or more passive sections;
the passive sections of the DBR laser comprise a wavelength selective DBR section and a phase section; and
the photoluminescent wavelength $\lambda_{PL}$ of the QWI output window is determined by referring to a determination of photo-current $I_{PHOTO}$ resulting from optical absorption at the phase or DBR section of the laser when the gain section is electrically pumped to produce lasing light.

10. A process as claimed in claim 1 wherein:
the semiconductor laser is characterized by a critical absorption wavelength $\lambda_C$; and
the $\lambda_{PL}$ screening protocol determines laser diode reliability by determining whether the photoluminescent wavelength $\lambda_{PL}$ of the QWI output window is low enough to ensure that the corresponding temperature at which $\lambda_C=\lambda_L$ falls outside of the operating temperature range of the laser.

11. A process as claimed in claim 1 wherein the lasing wavelength $\lambda_L$ is approximately 1060 nm and the $\lambda_{PL}$ screening protocol determines laser diode reliability by determining whether the photoluminescent wavelength $\lambda_{PL}$ of the QWI output window is less than approximately 99 nm.

12. A process as claimed in claim 1 wherein the lasing wavelength $\lambda_L$ is approximately 1060 nm and the $\lambda_{PL}$ screening protocol determines laser diode reliability by determining whether the energy band gap of the QWI output window is at least 79 meV larger than that corresponding to the lasing wavelength $\lambda_L$.

13. A process as claimed in claim 1 wherein the semiconductor laser diode comprises a DBR laser diode and the passive sections of the laser diode comprise a wavelength selective section, a phase section, or both.

14. A process as claimed in claim 1 wherein the QWI output window of the semiconductor laser diode is cleaved in air.

15. A process of manufacturing a semiconductor laser diode comprising a gain section, a QWI output window, and QWI waveguide areas, wherein:
the semiconductor laser diode is characterized by a critical absorption wavelength $\lambda_C$ and a lasing wavelength $\lambda_L$;
the QWI waveguide areas are fabricated using quantum well intermixing and define a QWI waveguide portion in a QWI output window of the laser diode;
the QWI output window is transparent to the lasing wavelength $\lambda_L$;
the QWI waveguide portion in the QWI output window is characterized by an energy bandgap that is larger than an energy bandgap of the gain section such that the band gap wavelength $\lambda_{QWI}$ in the QWI waveguide portion and the QWI output window is shorter than the lasing wavelength $\lambda_L$;
the QWI output window is characterized by a photoluminescent wavelength $\lambda_{PL}$; and
the manufacturing process comprises a $\lambda_{PL}$ screening protocol that determines laser diode reliability by determining whether the photoluminescent wavelength $\lambda_{PL}$ of the QWI output window is low enough to ensure that the corresponding temperature at which $\lambda_C=\lambda_L$ falls outside of the operating temperature range of the laser.

* * * * *